(12) United States Patent
Hsu

(10) Patent No.: US 7,276,800 B2
(45) Date of Patent: Oct. 2, 2007

(54) CARRYING STRUCTURE OF ELECTRONIC COMPONENTS

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 11/237,314

(22) Filed: Sep. 27, 2005

(65) Prior Publication Data
US 2006/0237854 A1    Oct. 26, 2006

(30) Foreign Application Priority Data
Apr. 26, 2005  (TW) .............................. 94113207 A

(51) Int. Cl.
*H01L 21/44* (2006.01)

(52) U.S. Cl. ............... 257/778; 257/737; 257/698; 257/E21.511; 438/613; 438/108

(58) Field of Classification Search ............... 257/698, 257/778
See application file for complete search history.

(56) References Cited

U.S. PATENT DOCUMENTS

| | | | | |
|---|---|---|---|---|
| 5,293,069 A | * | 3/1994 | Kato et al. | 257/698 |
| 5,689,091 A | * | 11/1997 | Hamzehdoost et al. | 174/255 |
| 6,696,764 B2 | * | 2/2004 | Honda | 257/778 |
| 6,919,508 B2 | * | 7/2005 | Forcier | 174/565 |
| 2004/0007771 A1 | * | 1/2004 | Shin et al. | 257/686 |
| 2004/0036158 A1 | * | 2/2004 | Tanaka et al. | 257/698 |
| 2004/0183187 A1 | * | 9/2004 | Yamasaki et al. | 257/700 |

* cited by examiner

*Primary Examiner*—Leonardo Andujar
*Assistant Examiner*—Krista Soderholm
(74) *Attorney, Agent, or Firm*—Fulbright & Jaworski L.L.P.

(57) ABSTRACT

A carrying structure of electronic components is proposed. The carrying structure includes at least one supporting board with at least one cavity disposed thereon, at least one adhesive layer formed on the supporting board, and at least one electronic component having an active face and a non-active face located in the cavity. The gap between the cavity and the electronic component is filled with a portion of the adhesive layer, and thus the electronic component is fixed in the cavity of the supporting board.

9 Claims, 5 Drawing Sheets

CARRYING STRUCTURE OF ELECTRONIC COMPONENTS

FIELD OF THE INVENTION

The present invention relates to a carrying structure of electronic components, and more particularly, to a carrying structure for carrying and fixing electronic components.

BACKGROUND OF THE INVENTION

IBM corp. introduced flip chip package technique in early 1960, the flip chip technique differs from the earlier wire bonding technique in that electrical connections between a semiconductor chip and a circuit board are established through solder bumps rather than traditional gold wires. Advantages of the flip chip technique are increased packaging density and reduced package size. Additionally, the flip chip technique requires no metal conductive wires, thus enhancing electrical properties and satisfying the needs for high-density and high-speed semiconductor devices.

In current flip chip technique, electrode pads are disposed on an active face of a semiconductor IC chip, and corresponding electrode pads are also provided on the circuit board for carrying the chip. Solder bumps or other conductive adhesives can be appropriately disposed between the chip and the circuit board, so that the active face of the chip is connected face down on the circuit board, wherein the electrical and mechanical connections between the chip and the circuit board are provided through the solder bumps or conductive adhesives.

FIG. 1 shows a Flip Chip Ball Grid Array (FCBGA) packaging structure in U.S. Pat. No. 6,774,498. A semiconductor chip 10 comprises an active surface, on which electrode pads 101 for signal input and output are provided. Metal bumps 11 are formed on the electrode pads 101 and electrically connected to electrical connecting pads 121 of a circuit board 12. The circuit board is formed with a plurality of wiring layer 122 and insulating layers 123; conductive structures 125 are connected between two wiring layers 122. On the uppermost wiring layer 122 of the circuit board 12 is formed with a solder mask 13 to protect the wiring layer 122 while expose the electrical connecting pads 121. Conductive structures such as solder balls 14 are formed on the electrical connecting pads 121, completing the FCBGA packaging structure. However, during the fabrication process of the FCBGA package, the circuit board 12 is separately fabricated from the process of electrically connecting the semiconductor chip 10 to the circuit board 12 for packaging. In other words, the circuit board is an independent process, while connecting the semiconductor chip 10 to the circuit board 12 is another independent process. These two processes being independently implemented results in uneven quality in production and long production cycle, and its electrical properties can only reach certain levels but cannot be further improved. Moreover, although the FCBGA structure can be utilized in high pin count and high frequency products, but the overall cost of packaging is high and the technique still faces with many limitations, especially in the electrical connections. Due to environmental concerns, conventionally used soldering materials for electrical connections, such as lead (Pb), are banned, and instead alternative materials with less desirable electrical, mechanical and physical properties are used.

Additionally, during the fabrication of flip chip semiconductor device, after a wafer IC fabrication step, an Under Bump Metallurgy (UBM) structure layer is formed on the electrode pads of the chips in the wafer for carrying metal bumps, then a singulation process is performed to segment the wafer into a plurality of single chips, then each semiconductor chip is electrically connected to a circuit board, wherein the fabrication processes for the UBM structure layer and the metal bumps are very expensive and complex.

Thus, for a flip chip semiconductor device that requires corresponding electrical connecting units (e.g. metal bumps and pre-soldering bumps) to be respectively formed on the semiconductor chip and the corresponding circuit board, it not only increases the number of fabrication steps and cost, but also reduces the reliability of the fabrication.

Moreover, the aforementioned semiconductor packaging structure is directly adhere to the topmost area of the circuit board and encapsulated with gel, and the bottom surface of the circuit board is mounted with solder bumps. Such a vertical stacking structure increases the overall height. In addition, when the semiconductor chip is sealed with the gel, it can no longer make other connections, such as for chip stacking or circuit board stacking, thereby reducing the flexibility in application of the packaged products.

Furthermore, under the trend for high-functionality and high-speed electronic products, passive components such as resistors, capacitors, and inductors are required to be integrated into the semiconductor package to increase or stabilize the electrical functionalities of the electronic products. However, these passive components are usually mounted on the surface of the circuit board, conventionally on the corners of the circuit board or additional layout areas outside the semiconductor connecting region of the circuit board to prevent blocking the electrical connection of bonding fingers between the semiconductor chip and the circuit board. However, limiting the passive components reduces the routability of wires on the surface of the circuit board. The number of the passive components is also limited concerning locations of the bonding fingers. Following the demands for high functionality of the semiconductor package, the number of passive components is increased accordingly, which will forcibly increase the package size to accommodate for large numbers of semiconductor chips and passive components.

SUMMARY OF THE INVENTION

In the light of forgoing drawbacks, an objective of the present invention is to provide a carrying structure of electronic components to effectively mount the electronic component in the carrying structure.

Another objective of the present invention is to provide a carrying structure of electronic components for mounting different electronic components therein to provide better electrical functionalities.

In accordance with the above and other objectives, the present invention provides a carrying structure of electronic components. In one embodiment, the carrying structure comprises at least one supporting board including at least one cavity; at least one electronic component including an active face and a non-active face disposed in the cavity of the supporting board; and at least one adhesive layer formed in a surface of the supporting board, wherein a portion of the adhesive layer fills a gap between the cavity and the electronic component, such that the electronic component is fixed in the cavity of the supporting board.

In one embodiment of the present invention, the adhesive layer forming on the surface of the supporting board is one selected from the group consisting of an organic film dielectric material, liquid organic resin material and Prepreg. Said materials can be photosensitive or non-photosenstive organic resin selected from the group consisting of ABF (Ajinomoto Build-up Film)•PPE(Poly(phenylene ether)), PTFE(Poly(tetra-fluoroethylene)), FR4, FR5, BT(Bismaleimide Triazine), LCP(Liquid Crystal Polymer), BCB(Benzocyclo-buthene), PI(Poly-imide) and Aramide. In one embodiment, the supporting board can be made of a metal material, a ceramic material, a circuit board having wiring structures or other dielectric materials. The metal material is preferably one selected from the group consisting of copper, aluminum, nickel, iron, titanium and magnesium or an alloy material thereof. Additionally, the supporting board may be a circuit board with wiring structure. The electronic component can be a passive component, an active component, an optoelectronics element, a semiconductor chip or other suitable element.

Moreover, the active face of the electronic component can be selectively flushed with or protruding out of the top of the carrying structure, and the non-active face of the electronic component can be selectively flushed with or protruding out of the bottom of the carrying structure.

It can be understood that the above construction allows the active face of the electronic component to be exposed from the cavity of the carrying structure for directly forming subsequent wiring layer structure thereon. Thereby, the complicated fabrication processes and high cost due to conventional approach of using electrical connecting units for connecting the semiconductor chip to the circuit board can be eliminated. Moreover, the reliability of the fabrication processes can be improved.

Meanwhile, the electronic component is adhered to the carrying structure via pressing the adhesive layer. The present invention thus requires no additional injection of adhesive layer to fill the cavity of the supporting board. This reduces the size of package since the semiconductor chip is no longer required to be adhered on direct top of the circuit board and encapsulated with encapsulation material. Furthermore, the electronic component can be secured firmly in the carrying structure. Several different electronic components can be disposed simultaneously in the carrying structure, providing better electrical functionalities, improved flexibility in application of the package products, reduced routing, and improved quality and reliability of the semiconductor packages.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention will now be described in detail by the following specific embodiments with reference of the drawings, however, it should be noted that the structures and shapes illustrated in the description and drawings are for illustration only rather than limiting the present invention.

First Embodiment

The carrying structure of electronic components comprises a supporting board with at least one cavity; at least one electronic component having an active face and a non-active face provided in the corresponding cavity of the supporting board; and at least one adhesive layer formed on a surface of the supporting board, wherein the adhesive layer partly fills a gap between the cavity and the electronic component, such that the electronic component is fixed in the cavity of the supporting board.

Figure 1:
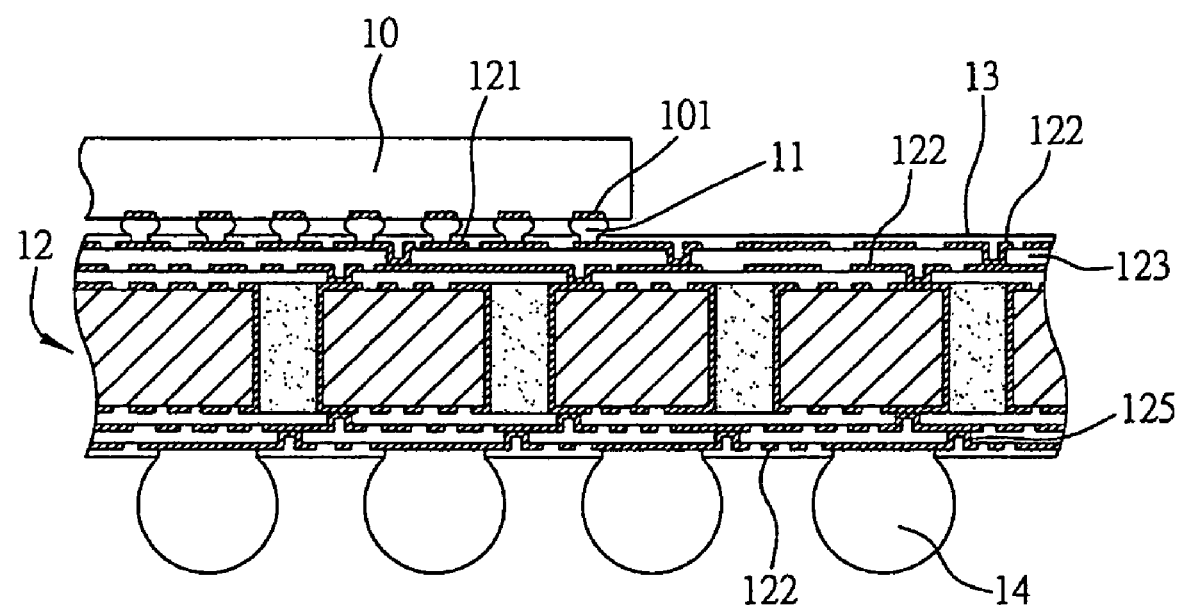
FIG. 1 shows a sectional schematic diagram of a conventional flip chip semiconductor package.
Figure 2A:
FIGS. 2A to 2C are schematic diagrams showing a carrying structure of electronic components according to a first embodiment of the present invention.
Figure 2A:
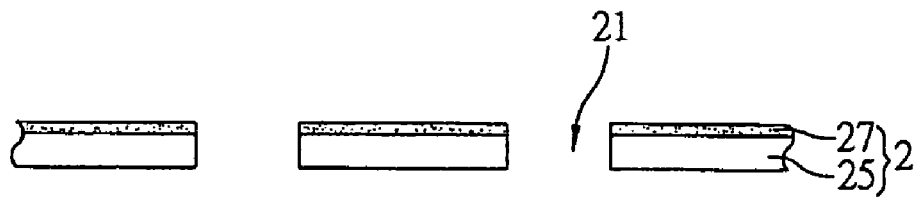
Figure 2B:
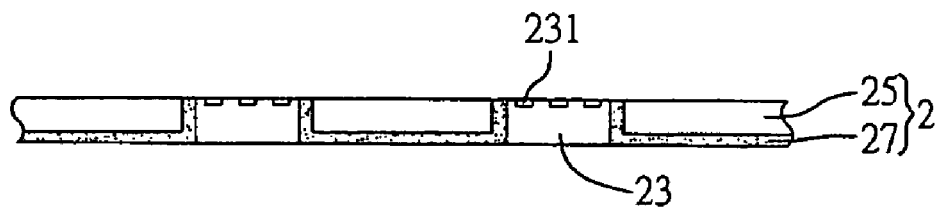
Figure 2B:
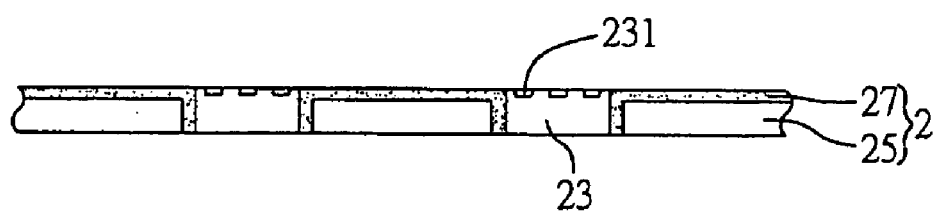

Referring now to FIGS. 2A and 2B showing schematic diagrams of the carrying structure of electronic components of the present invention. The carrying structure 2 comprises a supporting board 25 having at least one cavity 251, wherein an adhesive layer 27 is formed on a surface of the supporting board 25. In this embodiment, the carrying structure 2 may be for example a double-layered structure comprising the supporting board 25 and the adhesive layer 27 formed on the surface of the supporting board 25; wherein the adhesive layer 27 can be one selected from the group consisting of an organic film dielectric material, liquid organic resin material and Prepreg. Said materials can be photosensitive or non-photosenstive organic resin selected from the group consisting of ABF(Ajinomoto Build-up Film)•PPE(Poly(phenylene ether)), PTFE(Poly(tetra-fluoroethylene)), FR4, FR5, BT(Bismaleimide Triazine), LCP (Liquid Crystal Polymer), BCB(Benzocyclo-buthene), PI(Poly-imide) and Aramide. The supporting board 25 can be made of a metal material, a ceramic material, a circuit board having wiring structures or other dielectric materials. The metal material is preferably one selected from the group consisting of copper, aluminum, nickel, iron, titanium and magnesium or an alloy material thereof. The cavity 251 of the supporting board 25 is provided with at least one electronic component 23, and a plurality of electrode pads 231 are formed on an active face of the electronic component 23. When the electronic component 23 is placed in the cavity 251 of the supporting board, the carrying structure 2 is heated and pressed, such that a portion of the adhesive layer 27 on the surface of the supporting board 25 fills a gap between the cavity 251 and the electronic component 23 to fix the electronic component 23 in the cavity 251 of the supporting board. The electronic component can be a passive component, an active component, an optoelectronics element, a semiconductor chip or other suitable element. The electronic component may comprise electrode pads 231 made of metal.

Accordingly, the electronic component can be effectively secured in the carrying structure. Alternatively, a plurality of electronic components can be embedded so that several different electronic components can be mounted in the carrying structure simultaneously.

Figure 2C:
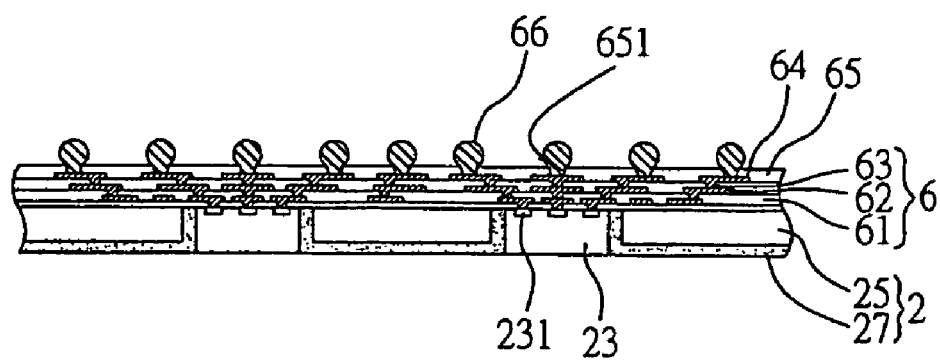

Referring now to FIG. 2C, Circuit build-up process is performed. A circuit build-up structure 6 is formed on one side or both sides of the carrying structure 2 receiving the electronic component 23. The circuit build-up structure 6 comprises a dielectric layer 61, a wiring layer 62 stacked on the dielectric layer 61, and a conductive structure 63 formed on the dielectric layer 61. The conductive structure 63 electrically connected to the electrode pads 231 of the electronic component 23. A plurality of connecting pads 64 are formed on a surface of the circuit build-up structure 6, and a solder mask 65 is formed on the outermost surface of the circuit build-up structure 6. The surface of the solder mask 65 has a plurality of openings 651 for exposing the connecting pads 64 of the circuit build-up structure 6, and conductive elements 66 (such as solder ball) connected to the connecting pads 64 are formed in the opening 651 of the solder mask 65. The conductive elements 66 can also be made of pin-shaped metals or other conductive adhesive materials.

Referring to FIGS. 2A' and 2B' showing an alternative implementation aspect of this embodiment. This alternative implementation differs from the previous embodiment in that the adhesive layer 27 is positioned in a surface of the supporting board 25 opposite to the surface of the supporting board 25 with the adhesive layer in the previous embodiment. The electronic component 23 is placed in the cavity 251 of the supporting board, and the carrying structure 2 is hot pressed, such that a portion of the adhesive layer 27 on the surface of the supporting board 25 fills a gap between the cavity 251 and the electronic component 23 to fix the electronic component 23 in the cavity 251 of the supporting board 25.

Second Embodiment

The carrying structure of electronic components of this embodiment comprises at least a first supporting board and a second supporting board having at least one cavity, respectively; at least one adhesive layer formed between the first and the second supporting boards; and at least one electronic component comprising an active and non-active face provided in the corresponding cavities of the first and second supporting boards, wherein a portion of the adhesive layer fills a gap between the electronic element and the cavities of the first and second supporting boards, thereby mounting the electronic component in the cavities of the first and second supporting boards.

Figure 3A:
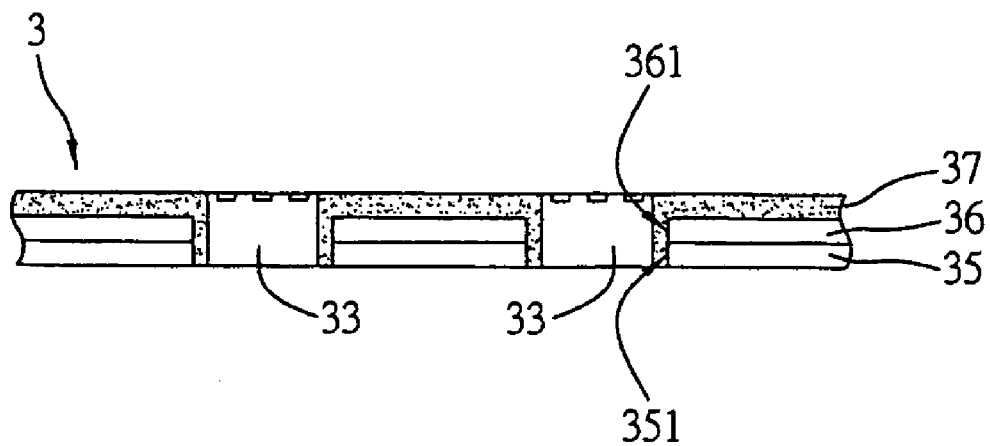
FIGS. 3A to 3C are schematic diagrams showing a carrying structure of electronic components according to a second embodiment of the present invention.
Figure 3B:
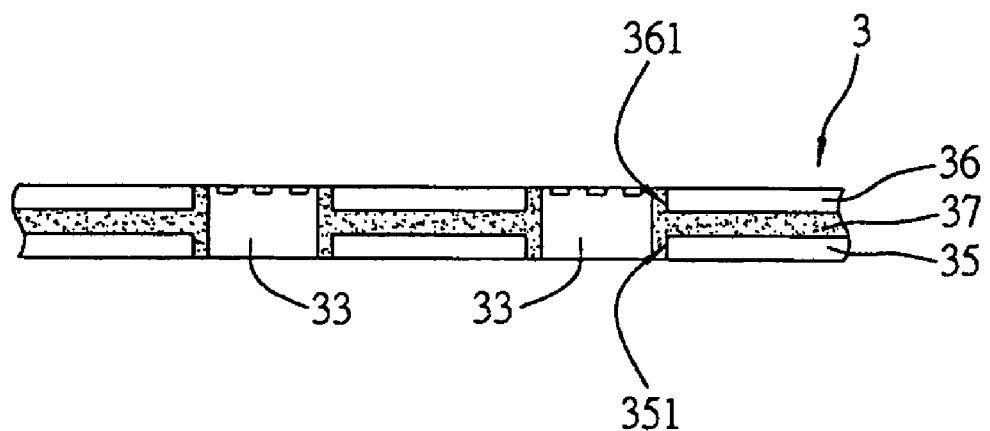
Figure 3C:
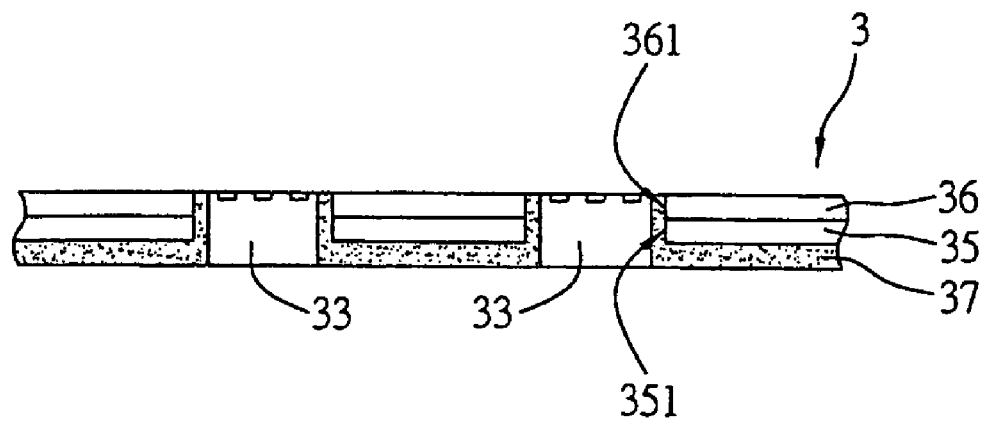

Referring to FIGS. 3A to 3C, schematic diagrams of a carrying structure 3 for electronic component according to another embodiment of the present invention are shown. The second embodiment essentially differs from the first embodiment in that the carry structure 3 is a multi-layered structure with at least one electronic component, an adhesive layer made of organic resin and at least two supporting boards. In this embodiment (as shown in FIG. 3A), the carrying structure 3 can be for example a three-layered structure comprising a first supporting board 35, a second supporting board 36 and an adhesive layer 37. The adhesive layer can be made of organic resin materials. The first and second supporting boards 35,36 can be made of metal materials, ceramic materials, circuit boards with wiring structure or other dielectric materials. The second supporting board 36 is stacked on the surface of the first supporting board 35, where the adhesive layer 37 is formed on a surface of the second supporting board 36 without the first supporting board 35. The first and second supporting boards 35 and 36 respectively have cavities 351 and 356 for receiving the electronic component 33.

In another aspect of this embodiment as shown in FIG. 3B, the carrying structure 3 comprises an adhesive layer 37 disposed between first and second supporting boards 35 and 36. The first and second supporting boards 35 and 36 respectively have cavities 351 and 361 for receiving the electronic component 33.

In yet another aspect of this embodiment as shown in FIG. 3C, the carrying structure 3 comprises a first supporting board 35 and a second supporting board 36 stacked on the first supporting board 35, and an adhesive layer formed on a surface of the first supporting board 35 not connected to the second supporting board 36. The first and second supporting boards 35 and 36 respectively have cavities 351 and 361 for receiving the electronic component 33.

In the above three-layered embodiments, the carrying structure 3 is hot pressed, so that the adhesive layer 37 between the first and second supporting boards or on a surface of one of the first or second supporting board partially fills a gap between the electronic component 33 and the cavities 351 and 361 to secure the electronic component 33 firmly in the cavities 351 and 361 of the first and second supporting boards 35 and 36.

From the above, it can be understood that in the previous embodiments, the carrying structure may be a multi-layered structure with an organic resin adhesive layer, wherein the adhesive layer is hot pressed to firmly mount the electronic component in the supporting board(s) made of materials such as metal, ceramic, circuit board(s) with wiring structure or other dielectric materials, without the need for additionally injected adhesive material.

Third Embodiment

Figure 4A:
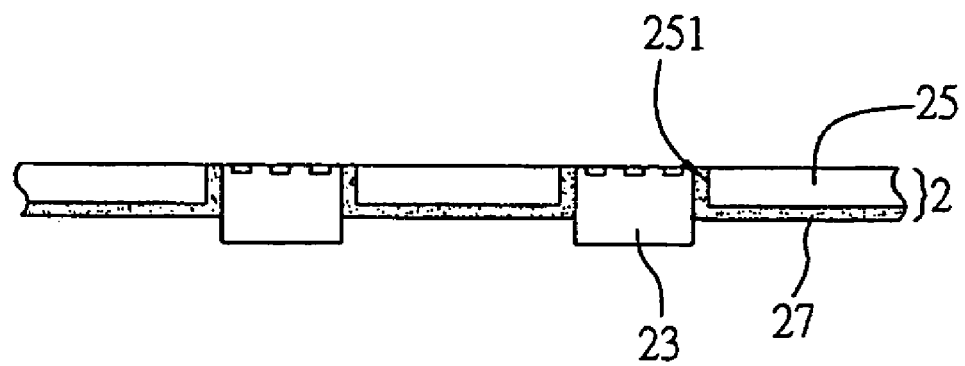
FIGS. 4A to 4C are schematic diagrams showing a carrying structure of electronic components according to a third embodiment of the present invention.
Figure 4B:
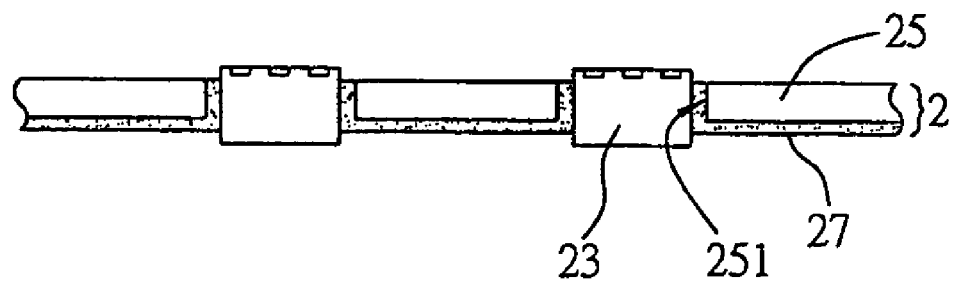
Figure 4C:
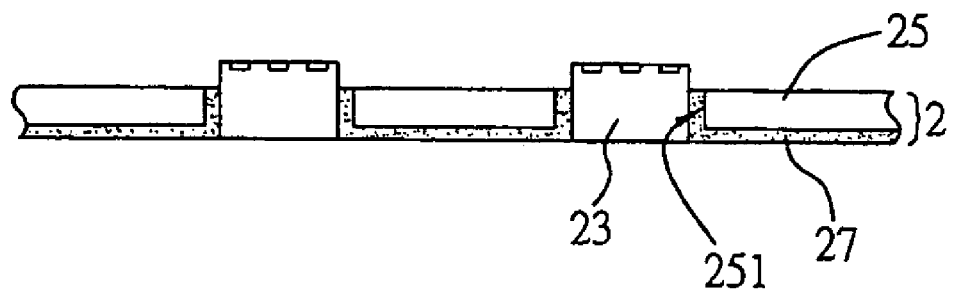

Referring to FIGS. 4A to 4C, schematic diagrams of a carrying structure of electronic components according to still another embodiment of the present invention are shown, wherein like elements are designated with like reference numerals and will not be described in detail in order to not obscure the features of the present invention.

As shown in FIG. 4A, the carrying structure comprises a supporting board 25, at least one electronic component 23 and an adhesive layer 27 formed on a surface of the supporting board 25.

The supporting board 25 has at least one cavity 251. Although the carrying structure 2 is shown as a two-layered structure comprising the supporting board 25 and the adhesive layer 27, however the present invention is not limited to this.

The electronic component 23 has an active face and a non-active face, where the active face is on the top surface and the non-active face is on bottom surface. The electronic component 23 is disposed in the cavity of the supporting board 25. The electronic component 23 can be a passive component, an active component, an optoelectronics component, a semiconductor chip or other suitable components. In this embodiment, the active face of the electronic component 23 is flush with the top of the carrying structure 2, and the non-active face of the electronic component 23 protrudes out of the bottom of the carrying structure 2.

The adhesive layer 27 partially fills a gap between the cavity 251 and the electronic component 23, so as to fix the electronic component 23 in the cavity 251 of the supporting board 25. The adhesive layer 27 filling in the cavity 251 is achieved by hot pressing the adhesive layer 27 on the surface of the supporting board 25.

This method can also be applied to placing the electronic component 33 of the second embodiment in the carrying structure of FIGS. 3A to 3C, such that the active face of the electronic component 3 is flushed with the top of the carrying structure 3; or the non-active face is flushed with the bottom of the carrying structure 3; or the active face of the electronic component 3 protrudes out of the top of the carrying structure 3; or the non-active face protrudes out of the bottom of the carrying structure 3.

With such construction, the structure of the carrying structure of electronic components can be simplified, while the electronic component can be securely fixed in the carrying structure, and a better electrical functionality is provided. Thus, the present invention successfully solves the problems in the prior art.

Fourth Embodiment

Figure 5A:
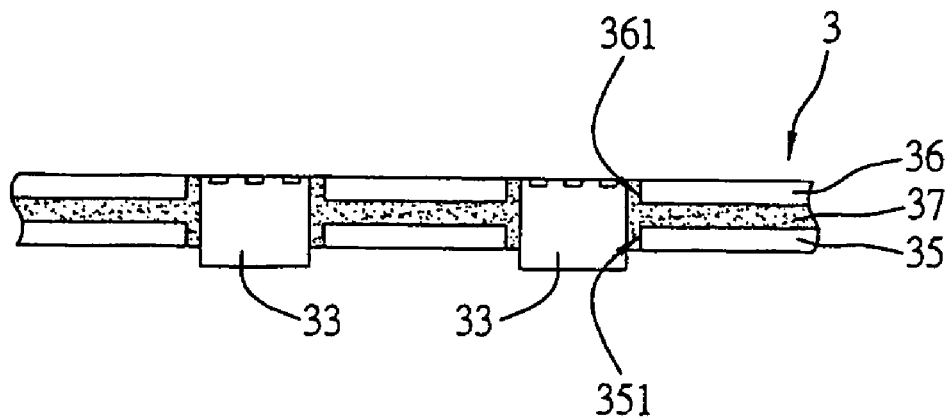
FIGS. 5A to 5C are schematic diagrams showing a carrying structure of electronic components according to a fourth embodiment of the present invention.
Figure 5B:
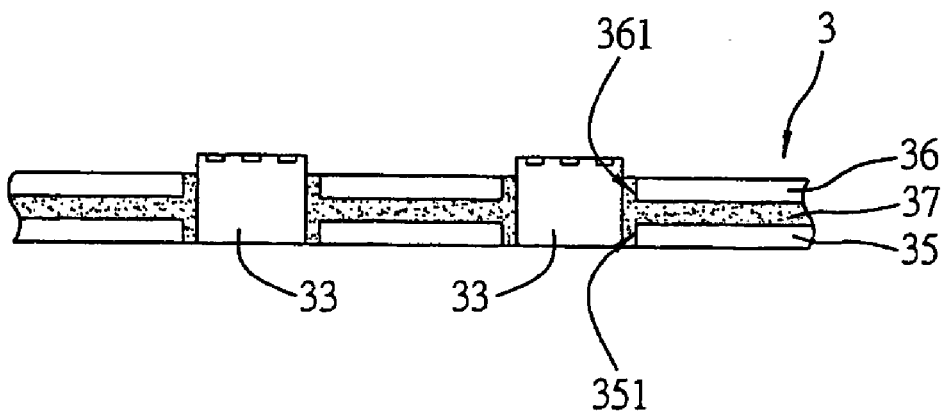
Figure 5C:
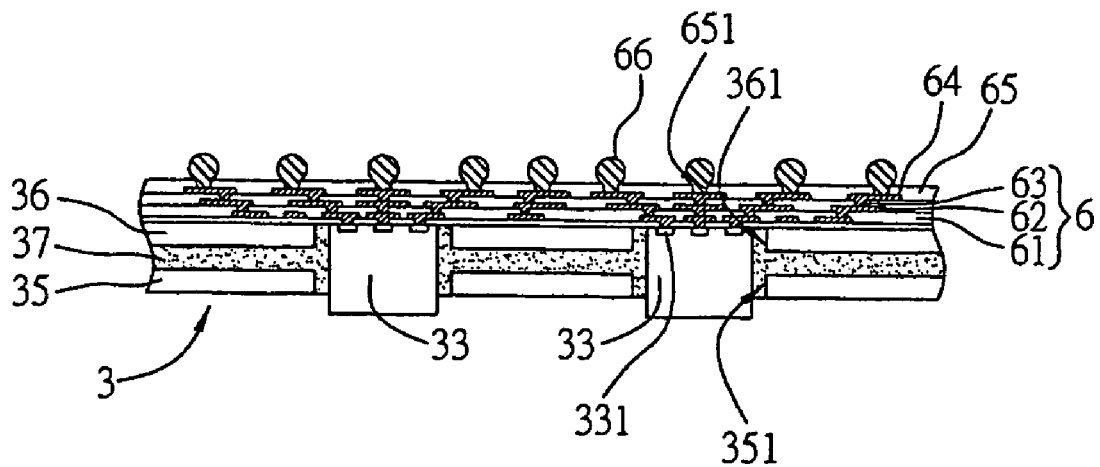

Referring to FIG. 5A, a schematic diagram of a carrying structure according to another embodiment of the present invention is shown. The carrying structure 3 is a three-layered structure comprising first and second supporting boards 35 and 36 and an adhesive layer 37 disposed therebetween. The first and second supporting boards 35 and 36 have respective cavities 351 and 361 for receiving an electronic component 33. In this three-layered embodiment, the carrying structure 3 is hot pressed such that the adhesive layer 37 between the first and second supporting boards 35 and 36 partially fills a gap between the electronic component 33 and the cavities 351 and 361, mounting the electronic component 33 in the cavities 351 and 361 of the first and second supporting boards 35 and 36. The non-active face of the electronic component protrudes out of the bottom of the carrying structure 3. Alternatively, the carrying structure 3 is a three-layered structure comprising first and second supporting boards 35 and 36 and an adhesive layer 37 disposed therebetween. The first and second supporting boards 35 and 36 have respective cavities 351 and 361 for receiving an electronic component 33, and wherein the active face of the electronic component 33 protrudes out of the top of the carrying structure 3, as shown in FIG. 5B.

Referring to 5C, subsequent layering process can be performed. A circuit build-up structure 6 is formed on the carrying structure receiving the electronic component 33. The circuit build-up structure 6 can also be implemented on one side or both sides of the carrying structure 2. The circuit build-up structure 6 is already described in previous embodiments and thus will not be described again.

Other advantages and effects will be readily appreciated by those skilled in the art via the detailed description disclosed in this specification. The present invention can be practiced by other embodiments, and should therefore cover various modifications and variations made to the herein-described details of the present invention, provided they fall within the scope of the present invention as defined in the following appended claims.

What is claimed is:

1. A carrying structure of electronic components, comprising:

a first supporting board and a second supporting board, each of the first and second supporting boards having one through cavity;

an adhesive layer formed between the first and second supporting boards;

an electronic component having an active face and a non-active face, a plurality of electrode pads formed on the active face of the electronic component and disposed in the through cavities of the first and second supporting boards, wherein a portion of the adhesive layer fills a gap between the electronic component and the through cavities of the first and second supporting boards, so as to fix the electronic component in the through cavities of the first and second supporting boards; and a circuit build-up structure formed on the second supporting board and the active face electronic component, wherein a plurality of conductive structures are formed in the circuit build-up structure and electrically connected to the electrode pads of the electronic component.

2. The carrying structure of claim 1, wherein the adhesive layer is made of one of an organic dielectric material, a liquid organic resin material and a Prepreg.

3. The carrying structure of claim 1, wherein the electronic component is one selected from the group consisting of a passive component, an active component, an optoelectronics element, and a semiconductor chip.

4. The carrying structure of claim 1, wherein the active face of the electronic component is flush with a top surface of the carrying structure, the non-active face of the electronic component protrudes out of a bottom surface of the carrying structure.

5. The carrying structure of claim 1, wherein the active face of the electronic component protrudes out of a top surface of the carrying structure, and the non-active face of the electronic component is flush with a bottom surface of the carrying structure.

6. The carrying structure of claim 1, wherein a plurality of connecting pads are formed on a surface of the circuit build-up structure.

7. The carrying structure of claim 1, wherein the circuit build-up structure comprises a dielectric layer, a wiring layer stacked on the dielectric layer, and a conductive structure formed in the dielectric layer.

8. The carrying structure of claim 6, further comprising a solder mask formed on the surface of the circuit build-up structure, and having a plurality of openings for exposing the connecting pads of the circuit build-up structure.

9. The carrying structure of claim 1, wherein the active face of the electronic component is flush with a top surface of the carrying structure, the non-active face of the electronic component is flush with a bottom surface of the carrying structure.

* * * * *